United States Patent
King et al.

(10) Patent No.: US 6,586,669 B2
(45) Date of Patent: Jul. 1, 2003

(54) LATTICE-MATCHED SEMICONDUCTOR MATERIALS FOR USE IN ELECTRONIC OR OPTOELECTRONIC DEVICES

(75) Inventors: Richard Roland King, Newbury Park, CA (US); James H. Ermer, Burbank, CA (US); Peter Colter, Canyon County, CA (US); Nasser H. Karam, Northridge, CA (US)

(73) Assignee: The Boeing Company, Seattle, WA (US)

( * ) Notice: Subject to any disclaimer, the term of this patent is extended or adjusted under 35 U.S.C. 154(b) by 1 day.

(21) Appl. No.: 09/876,193

(22) Filed: Jun. 6, 2001

(65) Prior Publication Data

US 2002/0195137 A1 Dec. 26, 2002

(51) Int. Cl.[7] .................. H01L 31/04; H01L 31/0264
(52) U.S. Cl. .............. 136/249; 136/255; 136/252; 136/261; 136/262; 257/431; 257/461
(58) Field of Search .................... 136/249, 255, 136/252, 261, 262; 257/431, 461

(56) References Cited

U.S. PATENT DOCUMENTS

| | | | | |
|---|---|---|---|---|
| 4,191,593 A | * | 3/1980 | Cacheux | 136/259 |
| 4,631,352 A | * | 12/1986 | Daud et al. | 136/249 |
| H667 H | * | 9/1989 | Bedair et al. | 136/249 |
| 5,800,630 A | * | 9/1998 | Vilela et al. | 136/249 |
| 6,300,558 B1 | * | 10/2001 | Takamoto et al. | 136/262 |

OTHER PUBLICATIONS

Takamoto et al, "High Efficiency InGaP/InGaAs Tandem Solar Cells on Ge Substrates," 28th IEEE Photovoltaic Specialists Conference, pp. 976–981, Sep. 15–22, 2000.*

* cited by examiner

Primary Examiner—Alan Diamond

(57) ABSTRACT

A perfectly or approximately lattice-matched semiconductor layer for use in an electronic or optoelectronic device. Perfectly lattice-matched ("PLM") semiconductor layers prevent or lessen the formation and propagation of crystal defects in semiconductor devices, defects that can decrease the performance characteristics of the device. For some semiconductors, the ability to optimize composition-dependent properties over the wider range of compositions that approximately lattice-matched ("ALM") semiconductor layers allows is more advantageous than the lower strain and dislocation density encountered for PLM layers. In addition, PLM cell layers and ALM cell layers are also expected to result in improved radiation resistance characteristics for some semiconductor devices.

31 Claims, 2 Drawing Sheets

LATTICE-MATCHED SEMICONDUCTOR MATERIALS FOR USE IN ELECTRONIC OR OPTOELECTRONIC DEVICES

STATEMENT REGARDING FEDERALLY SPONSORED RESEARCH

This invention was made with Government support under Contract No. F29601-98-2-0207 awarded by the United States Air Force. The Government has certain rights in this invention.

TECHNICAL FIELD

The present invention generally relates to semiconductor materials and, more particularly, to lattice-matched semiconductor materials for use in electronic and optoelectronic devices.

BACKGROUND ART

The interest in photovoltaic ("PV") cells in both terrestrial and non-terrestrial applications continues as concerns over pollution and limited resources continue. Irrespective of the application, and as with any energy generation system, efforts have been ongoing to increase the output and/or increase the efficiency of PV cells. In terms of output, multiple cells or cells having different energy bandgaps have been stacked so that each cell or cell can absorb a different part of the wide energy distribution in the sunlight.

In the prior art, the need to achieve perfectly lattice-matched materials in semiconductor layers of a solar cell or other optoelectronic device is not recognized. Neither is the need to or to control very small amounts of strain in adjacent semiconductor layers. In fact, for example, in prior art examples growing gallium arsenide ("GaAs") and gallium indium phosphide ("GaInP") layers on a germanium ("Ge") substrate, the lattice constant of the Ge had generally been thought to be sufficiently close to that of GaAs so that GaAs could be grown on a Ge substrate, and GaInP grown on the GaAs, with no detriment to the semiconductor properties.

In fact, the small lattice mismatch between GaAs and Ge causes crystal defects in the GaAs and in the bulk of cells. The presence of such crystal defects reduces the minority-carrier lifetimes in the bulk of the cells, increases the surface recombination velocity at interfaces, and creates possible shunting paths, all of which can reduce the current and voltage of photovoltaic devices, increase the reverse saturation current density and diode ideality factor of p-n junction in the device, and in general, degrade the performance of optoelectronic devices. Further, multi-junction solar cells and other optoelectronic devices having these crystal defects degrade under radiation.

Thus, it is highly desirable to prevent the formation of crystal defects in semiconductor layers and to increase the radiation resistance of multi-junction solar cells and other optoelectronic devices.

SUMMARY OF THE INVENTION

It is thus an object of the present invention to prevent the formation of crystal defects in semiconductor layers grown on a growth substrate. It is another object of the present invention to improve or change the characteristics of radiation resistance.

The above objects are accomplished by adding a small amount of an alloying element to a semiconductor material to manipulate the lattice constant of the semiconductor cell to become a perfectly lattice-matched ("PLM") semiconductor that may be used for the base, emitter, back-surface field ("BSF"), window, tunnel junction, cap, buffer, and/or other cells in a device. In this context, PLM means that the lattice mismatch between the PLM cell and the growth substrate is less than 0.074%. If specified, PLM may also refer to a difference in lattice mismatch between the PLM cell and an adjacent cell of less than 0.074%.

The PLM semiconductors prevent the formation and propagation of crystal defects in semiconductor devices, or reduce their concentration dramatically. The presence of such crystal defects reduces the minority-carrier lifetimes in the bulk of the cells, increases the surface recombination velocity at interfaces, and creates possible shunting paths. These all can reduce the current and voltage of photovoltaic devices, increase the reverse saturation current density and diode ideality factor of p-n junction in the device, and, in general, degrade the performance of optoelectronic devices. The use of PLM semiconductor cells in the device eliminates or reduces these sources of non-ideal loss, and brings the device performance closer to theoretical limits. The higher degree of lattice matching and the presence of additional elements may be used to improve or change device radiation resistance.

In an alternative preferred embodiment, or in combination with the PLM solar cell layers, the solar cell layers may be grown approximately lattice-matched ("ALM") to each other and to the growth substrate. A layer is defined to be ALM if it has an unstrained lattice constant that differs from that of the adjacent subcell layers, or that of the substrate, by an amount greater than or equal to 0.074%, but less than about 0.3%. The ALM layers are thus layers grown with a small intentional mismatch to the substrate or the adjacent subcells.

For some semiconductors, the ability to optimize composition-dependent properties over the wider range of compositions that ALM allows is more advantageous than the lower strain and dislocation density encountered for PLM layers. The small intentional mismatch of ALM cell layers is also expected to result in greater radiation resistance for some semiconductors, so that the balance between high beginning-of-life ("BOL") performance and radiation resistance may be optimized via the degree of small intentional mismatch, for a given solar cell radiation exposure and required service life.

BEST MODES FOR CARRYING OUT THE INVENTION

This invention describes a family of single-junction and multifunction cells in which the lattice constant is precisely matched to the Ge substrate by using ternary, quaternary, pentanary and, in general, multinary semiconductors in the subcells.

Figure 1:
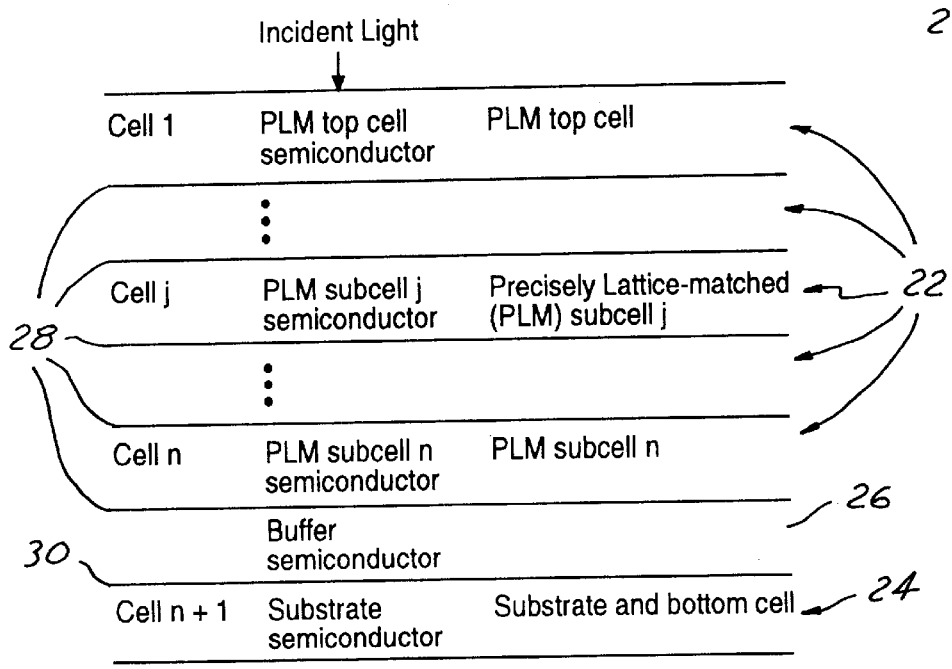
FIG. 1 is a cross-section of a general multijunction cell according to a preferred embodiment of the present invention having n subcells if the substrate is inactive, and n+1 subcells if the substrate is an active subcell, in which at least one of the subcells is composed of a PLM cell.

FIG. 1 depicts a cross-section of a multijunction cell 20 of the present invention having n subcells 22 in series if the substrate 24 is inactive, i.e., is not an active subcell, and an additional buffer semiconductor layer 26 if the substrate 24 is an active subcell. A tunnel junction 28 connects each subcell 22 in series and a nucleation layer 30 is grown between the buffer semiconductor layer 26 and the substrate 24, whether it is an active subcell or is inactive. While not shown, the multijunction cell 20 also may have a cap layer and may contain metal contact layers on any of the subcells 22. The metal contact layers may be formed to the window, emitter, base, BSF, and/or other subcell layers. Further, the metal contact layers may be formed to highly conductive layers such as tunnel junction layers that contact the subcell layers.

In general, one, more than one, or all of the subcells 22 are precisely lattice-matched ("PLM") to the growth substrate 24. Preferably, each of the subcells 22 is precisely lattice-matched ("PLM") to the growth substrate 24 and/or to adjacent cells of subcells 22. These subcells 22 may be composed of a base layer and an emitter layer. Further, the subcells 22 may contain a window layer or a back-surface field ("BSF") layer, as well as additional intrinsic layers, absorption layers, passivation layers, filter layers, reflection layers, or anti-reflection layers that are either part of or not part of the PLM semiconductor layers.

The PLM buffer semiconductor layer 26 material may be the same as one of the subcells 22 grown above it, or it may be a different PLM material.

For clarity, a PLM material is defined as having less than a 0.074% lattice mismatch between the PLM layer and the growth substrate 24. Many different semiconductor compositions are available for a PLM subcell 22 according to the present invention. The compositions are made by adding small amounts of alloying elements (typically 0.01–5%) to a semiconductor to precisely lattice-match them to the growth substrate. Some specific examples are shown below in Table 1.

TABLE 1

~1%-Sb GaAsSb ($GaAs_{0.99}Sb_{0.01}$)
~1%-In GaInAs ($Ga_{0.99}In_{0.01}As$)
$Ga_xIn_{1-x}P_yAs_{1-y}$, where y = −0.0208 + 2.003(1−x),
i.e., 2%-In, 2%-P GaInPAs ($Ga_{0.98}In_{0.02}P_{0.02}As_{0.98}$), or
3%-In, 4%-P GaInPAs ($Ga_{0.97}In_{0.03}P_{0.04}As_{0.96}$)
$GaP_uAs_vSb_w$, where w = 1−u−v, and u = −0.0207 + 2.183w,
i.e., 1%-P, 1.4%-Sb GaPAsSb ($GaP_{0.010}As_{0.976}Sb_{0.014}$), or
4%-P, 2.8%-Sb GaPAsSb ($GaP_{0.040}As_{0.932}Sb_{0.028}$)
52%-Al AlGaAs ($Al_{0.52}Ga_{0.48}As$)
49.5%-In GaInP ($Ga_{0.5051}In_{0.4949}P$)
$Al_aGa_bIn_cP$, where c = 1−a−b,
with a and b such that the AlGaInP is precisely lattice-matched to the Ge substrate.
AlGaInAs
AlInPAs
GaInAsSb FIGS. 2–6 show specific preferred embodiments of the present invention depicted in a triple-junction cell.

Figure 2:
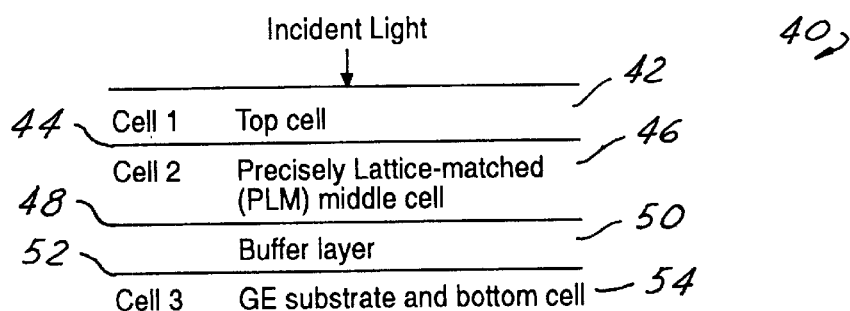
FIG. 2 is a cross-section of a triple-junction cell according to another preferred embodiment of the present invention having a middle cell composed of PLM layers.

Referring now to FIG. 2, one preferred embodiment of the present invention is depicted as having a triple-junction cell 40 having in series a 49.5%-In GaInP top cell 42, a tunnel junction 44, a PLM middle cell 46, a tunnel junction 48, an approximately 1%-In GaInAs buffer layer 50, a nucleation layer 52, and a Ge bottom cell and substrate 54. The top cell 42, middle cell 46, and buffer layer 50 are composed of PLM cells with respect to the lattice constant of the Ge bottom cell and substrate 54, here 5.6575 angstroms. Here, the buffer layer 50 may also be composed of approximately 1%-Sb GaPAsSb, 2%-In 2%-P GaInPAs, 3%-In 4%-P GaInPAs, 1%-P 1.4%Sb GaPAsSb, 4%-P 2.8%Sb GaPAsSb, 52%-Al AlGaAs, or 49.5%-In GaInP, while the PLM cells grown above the buffer layer 50 may or may not be composed of the same PLM material chosen for the buffer layer 50. Finally, the buffer layer 50 may be grown much thinner when PLM subcells are grown on the Ge bottom cell and substrate 54, resulting in shorter growth times, lower material use, and lower cost for manufacturing.

Figure 3:
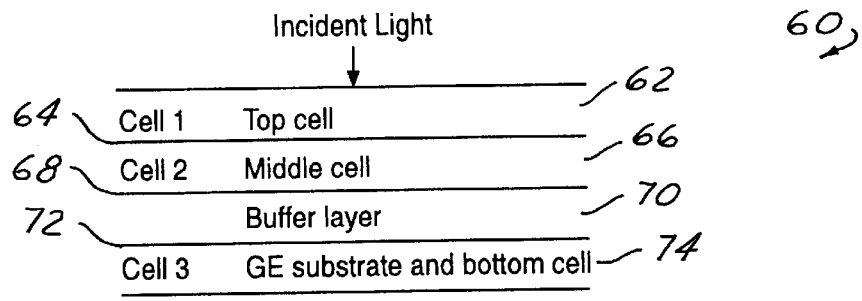
FIG. 3 is a cross-section of a triple-junction cell according to another preferred embodiment having a PLM middle cell having a base composed of approximately 1%-Sb GaAsSb.

Referring now to FIG. 3, another preferred embodiment of the present invention is depicted as having a triple-junction cell 60 having in series a 49.5%-In GaInP top cell 62, a tunnel junction 64, an approximately 1%-Sb GaAsSb PLM middle cell 66, a tunnel junction 68, an approximately 1%-In GaInAs or 1%-Sb GaAsSb buffer layer 70, a nucleation layer 72, and a Ge bottom cell and substrate 74. The top cell 62, middle cell 66, and buffer layer 70 are composed of PLM cells with respect to the lattice constant of the Ge bottom cell and substrate 74, here 5.6575 angstroms.

Figure 4:
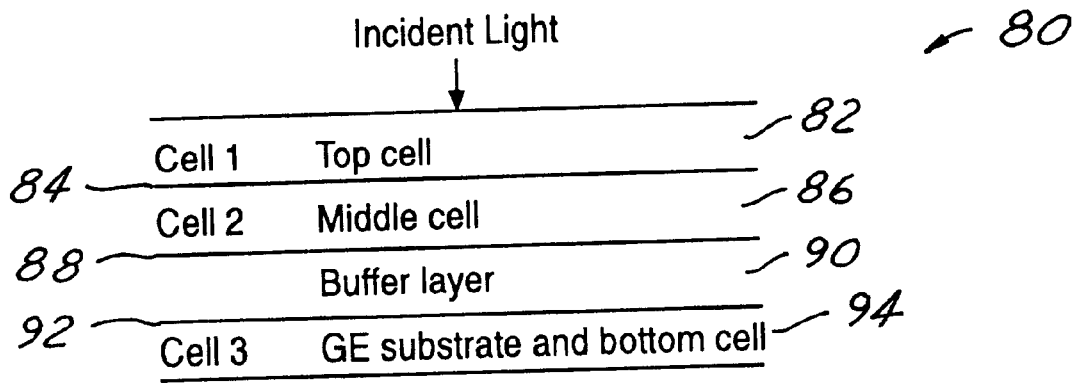
FIG. 4 is a cross-section of a triple-junction cell according to another preferred embodiment having a PLM middle cell having a base composed of approximately 2%-In, 2%-P GaInPAs.

Referring now to FIG. 4, another preferred embodiment of the present invention is depicted as having a triple-junction cell 80 having in series a 49.5%-In GaInP top cell 82, a tunnel junction 84, an approximately 2%-In 2%-P GaInPAs middle cell 86, a tunnel junction 88, an approximately 1%-In GaInAs or 1%-Sb GAAsSb buffer layer 90, a nucleation layer 92, and a Ge bottom cell and substrate 94. The top cell 82, middle cell 86, and buffer layer 90 are composed of PLM cells with respect to the lattice constant of the Ge bottom cell and substrate 94, here 5.6575 angstroms.

Figure 5:
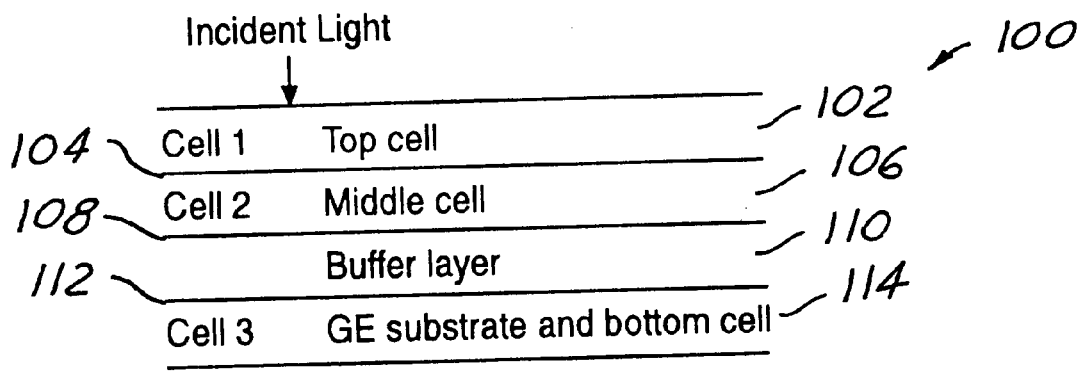
FIG. 5 is a cross-section of a triple-junction cell according to another preferred embodiment having a PLM middle cell having a base composed of approximately 3%-In, 4%-P GaInPAs.

Referring now to FIG. 5, another preferred embodiment of the present invention is depicted as having a triple-junction cell 100 having in series a 49.5%-In GaInP top cell 102, a tunnel junction 104, an approximately 3%-In 4%-P GaInPAs middle cell 106, a tunnel junction 108, an approximately 1%-In GaInAs buffer layer 110, a nucleation layer 112, and a Ge bottom cell and substrate 114. The top cell 102, middle cell 106, and buffer layer 110 are composed of PLM cells with respect to the lattice constant of the Ge bottom cell and substrate 114, here 5.6575 angstroms.

Figure 6:
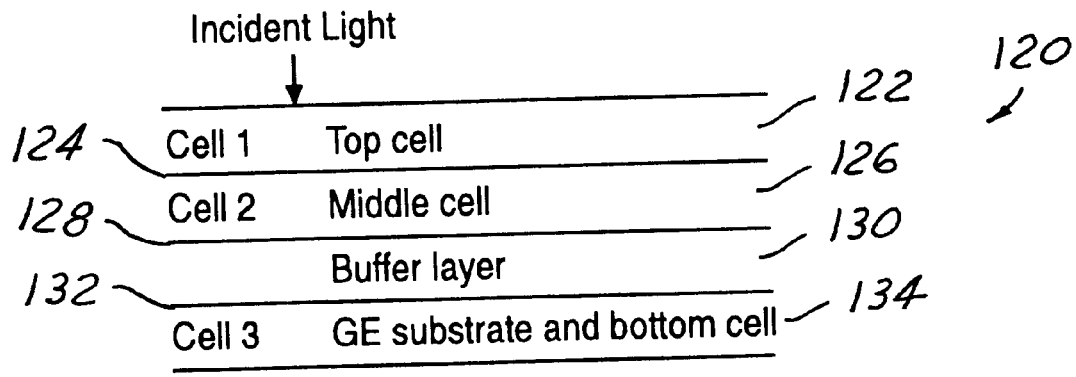
FIG. 6 is a cross-section of a triple-junction cell according to another preferred embodiment having a PLM middle cell having a base composed of approximately 1%-P, 1.4%-Sb GaPAsSb.

Referring now to FIG. 6, another preferred embodiment of the present invention is depicted as having a triple junction cell 120 having in series a 49.5%-In GaInP top cells 122, a tunnel junction 124, an approximately 1%-P 1.4%-Sb GaPAsSb middle cell 126, a tunnel junction 128, an approximately 1%-In GaInAs buffer layer 130, a nucleation layer 132, and a Ge bottom cell and substrate 134. The top cell 122, middle cell 126, and buffer layer 130 are composed of PLM cells with respect to the lattice constant of the Ge bottom cell and substrate 134, here 5.6575 angstroms.

In an alternative preferred embodiment, or in combination with the PLM solar cell layers described in FIG. 1, the subcell 22 layers may be grown approximately lattice-matched ("ALM") to each other and to the growth substrate 24. ALM is defined as having a lattice constant that differs from that of the adjacent subcell 22 layers or to the substrate 24 by an amount greater than or equal to 0.074%, but less than about 0.3%. The ALM layers are thus layers grown with a small intentional mismatch to the substrate 24 or the adjacent subcells 22.

Similar to the PLM subcells 22 of FIG. 1, the ALM subcells, comprising these ALM semiconductor layers, may be composed of a base layer and an emitter layer. Further, these subcells may contain a window layer or a back-surface field ("BSF") layer, as well as additional intrinsic layers, absorption layers, passivation layers, filter layers, reflection layers, or anti-reflection layers that are either part of or not part of the ALM semiconductor layers. Further, ALM and PLM semiconductor layers may be combined in the multi-junction cell structure, as well as within individual subcells.

The multijunction cell 20 also may have a cap layer and may contain metal contact layers on any of the subcells 22. The metal contact layers may be formed to the window, emitter, base, BSF, and/or other subcell layers. Further, the metal contact layers may be formed to highly conductive layers such as tunnel junction layers that contact the subcell layers.

For some semiconductors, the ability to optimize composition-dependent properties over the wider range of compositions that ALM allows is more advantageous than the lower strain and dislocation density encountered for PLM layers. For example, it is often desirable to have a GaInP top cell that is in slight compressive strain with respect to the PLM middle cell grown on a Ge substrate 24, such that the lattice constant of the GaInP top cell if it were unstrained would be greater than or equal to 0.074% larger than that of the PLM middle cell 22 and that of the Ge substrate 24. The small intentional mismatch of ALM cell layers is also expected to result in greater radiation resistance for some semiconductors, so that the balance between high beginning-of-life ("BOL") performance and radiation resistance may be optimized via the degree of small intentional mismatch, for a given solar cell radiation exposure and required service life.

This invention relates especially to space and terrestrial photovoltaic cells, for use in both non-concentrated sunlight (flat-plate systems) and concentrated sunlight. This invention also applies to other electronic and optoelectronic devices that rely on minority-carrier transport, such as semiconductor lasers (both edge-emitting lasers and vertical-cavity surface-emitting lasers ("VCSELs"), light-emitting diodes ("LEDs"), light sensors such as p-i-n diodes and valance photodiodes, and bipolar transistors including heterojunction bipolar transistors ("HBTs"). This invention also relates to unipolar transistors that include majority-carrier devices such as high-electron mobility transfers ("HEMTs") and metal-semiconductor field-effect transistors ("MESFETs").

While the invention has been described in terms of preferred embodiments, it will be understood, of course, that the invention is not limited thereto since modifications may be made by those skilled in the art, particularly in light of the foregoing teachings.

What is claimed is:
1. A solar cell comprising:
a growth substrate; and
at least one subcell(s), wherein each of said at least one subcells has a plurality of semiconductor layers, wherein at least one of said plurality of semiconductor layers within one of said at least one subcells is precisely lattice-matched to said growth substrate and is selected from the group consisting of approximately 1%-Sb GaAsSb (GaAs$_{0.99}$Sb$_{0.01}$) GaInPAs, GaPAsSb, AlGaInP, and GaInAsSb.

2. The solar cell of claim 1, wherein all of said at least one semiconductor layers within one of said at least one subcells are precisely lattice matched to said growth substrate.

3. The solar cell of claim 1, wherein the solar cell is selected from the group consisting of a single-junction solar cell and multijunction solar cell.

4. The solar cell of claim 1, wherein said growth substrate is an active subcell.

5. The solar cell of claim 1, wherein the composition of said at least one of said plurality of semiconductor layers precisely lattice-matched to said growth substrate contains an alloying element, said alloying element used to modify the lattice constant of said one of said plurality of semiconductor layers to precisely match the lattice constant of said growth substrate.

6. The solar cell of claim 5, wherein said alloying element comprises between approximately 0.01 and 5.0 percent by mole fraction of the composition of said one of said plurality of semiconductor layers.

7. The solar cell of claim 1, wherein each of said at least one subcells is comprised of a base layer and an emitter layer.

8. The solar cell of claim 7, wherein said each of said at least one subcells is also comprised of a third layer, wherein said third layer is selected from the group consisting of a window layer, a back-surface field (BSF) layers, an intrinsic layer, a passivation layer, an absorption layer, a filter layer, an anti-reflection layer, a reflection layer, and combinations thereof.

9. The solar cell of claim 1, further comprising a plurality of non-subcell semiconductor layers.

10. The solar cell of claim 9, wherein at least one layer of said plurality of non-subcell semiconductor layers is precisely lattice-matched to said growth substrate.

11. The solar cell of claim 9, wherein all of said plurality of non-subcell semiconductor layers are precisely lattice-matched to said growth substrate.

12. The solar cell of claim 9, wherein said plurality of non-subcell semiconductor layers is selected from the group consisting of a nucleation layer, a buffer layer, a tunnel junction layer, a cap layer, a contact layer, and a lateral conduction layer.

13. The solar cell of claim 7, wherein the composition of said base layer is selected from the group consisting of approximately 1%-Sb GaAsSb; approximately 1% In GaInAs; GaInPAs; GaPAsSb; AlGaAs; 49.5% In GaInP (Ga$_{0.505}$In$_{0.0495}$P); AlGaInP; AlGaInAs; AlInPAs; and GaInAsSb.

14. The solar cell of claim 7, wherein the composition of said emitter layer is selected from the group consisting of approximately 1%-Sb GaAsSb; approximately 1%-In GaInAs; GaInPAs; GaPAsSb; AlGaAs; 49.5%-In GaInP (Ga$_{0.505}$In$_{0.0495}$P); AlGaInAs; AlGaInAs; AlInPAs; and GaInAsSb.

15. The solar cell of claim 13, wherein the composition of said emitter layer is selected from the group consisting of approximately 1%-Sb GaAsSb; approximately 1%-In GaInAs; GaInPAs; GaPAsSb; AlGaAs; 49.5%-In GaInP (Ga$_{0.505}$In$_{0.0495}$P); AlGaInP; AlGaInAs AlInPAs; and GaInAsSb.

16. The solar cell of claim 1, wherein one of said plurality of semiconductor layers within one of said at least one subcells selected from the group consisting of approximately 1%-Sb GaAsSb (GaAs$_{0.99}$Sb$_{0.01}$); GaInPAs; GaPAsSb; AlGaInP; and GaInAsSb.

17. The solar cell of claim 9, wherein the composition one of said plurality of non-subcell semiconductor layers is selected from the group consisting of approximately 1%-Sb GaAsSb; approximately 1%-In GaInAs; GaInPAs; GaPAsSb; AlGaAs; 49.5%-In GaInP ($Ga_{0.505}In_{0.495}P$); AlGaInAs; AlGaInAs; AlInPAs; and GaInAsSb.

18. The solar cell of claim 1 further comprising at least one approximately lattice-matched subcell, wherein each of said at least one approximately lattice-matched subcell has a plurality of approximately lattice-matched semiconductor layers, wherein at least one of said plurality of approximately lattice-matched semiconductor layers is approximately lattice-matched to said growth substrate.

19. The solar cell of claim 18, wherein the composition of said one of said at least one approximately lattice-matched semiconductor layer contains an alloying element said alloying element used to modify the lattice constant of said one of said at least one approximately lattice-matched semiconductor layer to approximately match the lattice constant of said growth substrate.

20. The solar cell of claim 19, wherein said alloying element comprises approximately between 0.01 and 5.0 percent by mole fraction of the composition of said one of said at least one approximately lattice-matched semiconductor layer.

21. The solar cell of claim 1, wherein said substrate comprises a germanium growth substrate.

22. A solar-cell comprising:

a growth substrate;

at least one subcell(s); and a plurality of non-subcell semiconductor layers, wherein at least one of said plurality of non-subcell semiconductor layers is precisely lattice-matched to said growth substrate wherein said at least one of said plurality of non-subcell semiconductor layers is selected from the group consisting of approximately 1%-Sb GaAsSb ($GaAs_{0.99}Sb_{0.01}$), GaInPAs, GaPAsSb, AlGaInP, AlInPAs, and GaInAsSb.

23. The solar cell of claim 22, wherein all of said plurality of non-subcell semiconductor layers are precisely lattice-matched to said growth substrate.

24. The solar cell of claim 22, wherein said plurality of non-subcell semiconductor layers is selected from the group consisting of a nucleation layer, a buffer layer, a tunnel junction layer, a cap layer, a contact layer, and a lateral conduction layer.

25. The solar cell of claim 22, wherein each of said at least one subcells has a plurality of semiconductor layers, wherein at least one of said plurality of semiconductor layers within one of said at least one subcells is precisely lattice-matched to said growth substrate.

26. The solar cell of claim 25, wherein all of said at least one semiconductor layers within one of said at least one subcells are precisely lattice-matched to said growth substrate.

27. The solar cell of claim 22, wherein each of said at least one subcells has a plurality of semiconductor layers, wherein at least one of said plurality of semiconductor layers within one of said at least one subcells is approximately lattice-matched to said growth substrate.

28. The solar cell of claim 27, wherein all of said at least One semiconductor layers within one of said at least one subcells are approximately lattice-matched to said growth substrate.

29. The solar cell of claim 22, wherein the solar cell is a selected from the group consisting of a single-junction solar cell and multijunction solar cell.

30. The solar cell of claim 22, wherein said growth substrate is an active subcell.

31. The solar cell of claim 22, wherein said substrate comprises a germanium growth substrate.

* * * * *